U S 0 0 7 6 1 9 4 7 2 B 1

(12) United States Patent
Tekin et al.

(10) Patent No.: US 7,619,472 B1
(45) Date of Patent: Nov. 17, 2009

(54) NOISE-SHAPED BLOCKER-REJECT AMPLIFIER

(75) Inventors: Ahmet Tekin, Mission Viejo, CA (US);
Hassan Elwan, Lake Forest, CA (US);
Edward Youssoufian, Irvine, CA (US)

(73) Assignee: Newport Media, Inc., Lake Forest, CA (US)

( * ) Notice: Subject to any disclaimer, the term of this patent is extended or adjusted under 35 U.S.C. 154(b) by 0 days.

(21) Appl. No.: 12/132,834

(22) Filed: Jun. 4, 2008

(51) Int. Cl.
*H03F 3/45* (2006.01)
(52) U.S. Cl. ...................... 330/252; 330/303
(58) Field of Classification Search ......... 330/109–110, 330/303, 103, 213
See application file for complete search history.

(56) References Cited
U.S. PATENT DOCUMENTS 7,088,985 B2 * 8/2006 Ismail .................... 455/339
7,202,741 B2 * 4/2007 Park et al. ............... 330/254
2008/0297239 A1 * 12/2008 Elwan et al. ............ 327/557

* cited by examiner

*Primary Examiner*—Robert Pascal
*Assistant Examiner*—Hieu P Nguyen
(74) *Attorney, Agent, or Firm*—Rahman LLC (57) ABSTRACT

A fully differential amplifier that amplifies and filters a signal band of a communications channel, the signal band including a desired signal and at least one blocker signal of an adjacent communications channel, the fully differential amplifier includes a fully differential operational amplifier (op-amp) with a common mode feedback, the fully differential operational amplifier amplifying the desired signal, a variable input resistance connected to an input of the fully differential op-amp, and an asymmetric floating frequency dependent negative resistance (AFFDNR) filter connected to the fully differential op-amp between the input and an output of the fully differential op-amp. A plurality of inputs of the fully differential op-amp may be virtually grounded to reduce swings in a voltage. The AFFDNR filter filters the at least one blocker signal and includes a plurality of resistors that implement a high order filtering of the at least one blocker signal.

19 Claims, 10 Drawing Sheets

NOISE-SHAPED BLOCKER-REJECT AMPLIFIER

BACKGROUND

1. Technical Field

The embodiments herein generally relate to wireless communication devices, and more particularly to amplification of desired signals and filtering of undesired blocker signals in a signal band.

2. Description of the Related Art

In wireless communication systems, a desired signal in a channel of interest may be very weak due to very strong blockers in nearby channels. In order to increase the strength of the desired signal, the desired signal is to be amplified and the unwanted blocker signals in the nearby adjacent channels are filtered by high order filtering. An amplifier has to amplify the desired signal and reject the blockers and other out of band signals. For best dynamic range performance, gain and filtering should be interleaved. For best linearity of a signal, the out of band signals should be filtered first by a filter and then amplified by an amplifier.

For best noise performance, the signal is amplified first by the amplifier and then subsequently filtered by the filter. There are many ways to implement higher order filters using these two techniques. However, both techniques suffer from a limited noise performance. The main reason for this is that the active and passive components employed in both techniques are in the signal path. The active circuitry of the existing filter topologies is directly in the signal path and contributes to more noise. Thus, they directly add noise to the signal at all frequencies.

Additionally, if the filter precedes the amplifier, reducing its noise would require large chip area and power consumption. Further, the amplifier gain will be limited by the large blocker signals. Hence, a fundamental trade-off exists between cascading filter and amplification stages. Additionally, the filtering active circuitry in the signal path introduces DC offsets that cause the amplification blocks to clip. The active circuitry in the signal path can also cause I/Q imbalance which might degrade the receiver performance.

Thereby, the existing gain-filtering topologies require very large chip area and power consumption to achieve a low noise operation, while degrading I-Q matching and adding DC offsets. Hence, using classical gain filtering interleaved architectures to realize post down-conversion mixer low noise filter leads to an unacceptable power and area penalties. Therefore, the existing solutions achieve the amplification of the desired signal and rejection of the blockers with the cost of additional noise. Also, the components in the filtering section contribute DC-offsets to the signal path.

SUMMARY

In view of the foregoing, an embodiment herein provides a fully differential amplifier that amplifies and filters a signal band of a communications channel, the signal band including a desired signal and at least one blocker signal of an adjacent communications channel, the fully differential amplifier includes a fully differential operational amplifier (op-amp) with a common mode feedback, the fully differential operational amplifier amplifying the desired signal, a variable input resistance connected to an input of the fully differential op-amp, and an asymmetric floating frequency dependent negative resistance (AFFDNR) filter connected to the fully differential op-amp between the input and an output of the fully differential op-amp.

A plurality of inputs of the fully differential op-amp may be virtually grounded to reduce swings in a voltage. The fully differential op-amp obtains a predetermined gain with the feedback resistance and the variable input resistance. The AFFDNR filter filters the at least one blocker signal and includes a plurality of resistors that implement a high order filtering of the at least one blocker signal. The plurality of resistors may include at least one of a feedback resistance and an impedance resistance, the feedback resistance amplifying and filtering the signal band.

The AFFDNR filter may enable an implementation of complex zeros to realize elliptic transfer functions for a sharper filtering of the at least one blocker signal. The AFFDNR filter may include a plurality of amplifiers, a plurality of capacitors, and plurality of resistors. The plurality of capacitors comprises at least one of a feedback capacitor and a feedthrough AFFDNR. The feedthrough AFFDNR may be coupled to a first node and a second node, the first node receiving a finite input impedance $Z_A$, the $Z_A$ is a negative resistance when an opposing port is grounded, and the second node receiving a finite input impedance $Z_B$, the $Z_B$ is inductive when the opposing port is grounded.

In the feedthrough AFFDNR, the first node may be coupled to the second node by a plurality of capacitors, a plurality of resistors, a first op-amp, and a second op-amp, the plurality of capacitors may be connected in series with the plurality of resistors. The first op-amp and the second op-amp may be connected to the plurality of capacitors and the plurality of resistors in parallel.

Another embodiment provides an electrical circuit using an AFFDNR in a feedback path to amplify and filter a signal band of a communications channel, the signal band including a desired signal and at least one blocker signal of an adjacent communications channel, the electrical circuit includes a plurality of single-ended operational amplifiers (op-amps) amplifying the desired signal and connected in parallel to each other, a variable input resistance connected to an input of the op-amps, and an AFFDNR filter connected in parallel to the op-amps between the input and an output of the op-amps, the AFFDNR filtering the at least one blocker signal, the AFFDNR filter including a plurality of resistors that implement a high order filtering of the at least one blocker signal.

The plurality of resistors may include at least one of a feedback resistance and an impedance resistance, the feedback resistance amplifying and filtering the signal band. The electrical circuit further includes a filtering section including a capacitor connected in parallel to a resistor, and an AFFDNR. The input of the op-amps may control a signal swing. The AFFDNR filter may enable an implementation of complex zeros to realize elliptic transfer functions for a sharper filtering of the at least one blocker signal.

Another embodiment provides a method of amplifying and filtering a signal band of a communications channel in a gain-filtering architecture, the signal band including a desired signal and at least one blocker signal of an adjacent communications channel, the gain-filtering architecture including an operational amplifier (op-amp) and an AFFDNR filter, the method includes processing an input signal of the signal band by the op-amp to obtain an amplified signal, and filtering the at least one blocker signal of an adjacent communications channel by applying a short by means of a negative resistance in a feedback loop of the AFFDNR filter.

The op-amp may be at least one of a single fully differential op-amp and a plurality of single ended op-amps. The feedback loop of the AFFDNR filter may include a plurality of resistors implementing a high order filtering of the at least one blocker signal. The plurality of resistors may include at least one of a feedback resistance and an impedance resistance, the feedback resistance amplifying and filtering the signal band. The filtering may be performed by a filtering section comprising a capacitor connected in parallel to a resistor and an AFFDNR.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which.

DETAILED DESCRIPTION OF PREFERRED EMBODIMENTS

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

The embodiments herein provide a low noise operation technique to amplify a desired signal effectively with a high order filtering feature into an amplifier and reject blockers with a small device area and a low-power consumption with a noise shaping characteristic. In addition, the filtering circuitry does not degrade I-Q matching and does not contribute any extra DC-offsets. The embodiments herein utilize the noise shaping properties of AFFDNR to achieve high order filtering without additional in band noise.

The noise of all passive and active components used to realize a filtering operation is shaped and moved out of a pass-band of the filter. Referring now to the drawings, and more particularly to FIGS. 1A through 10, where similar reference characters denote corresponding features consistently throughout the figures, there are shown preferred embodiments.

Figure 1A:
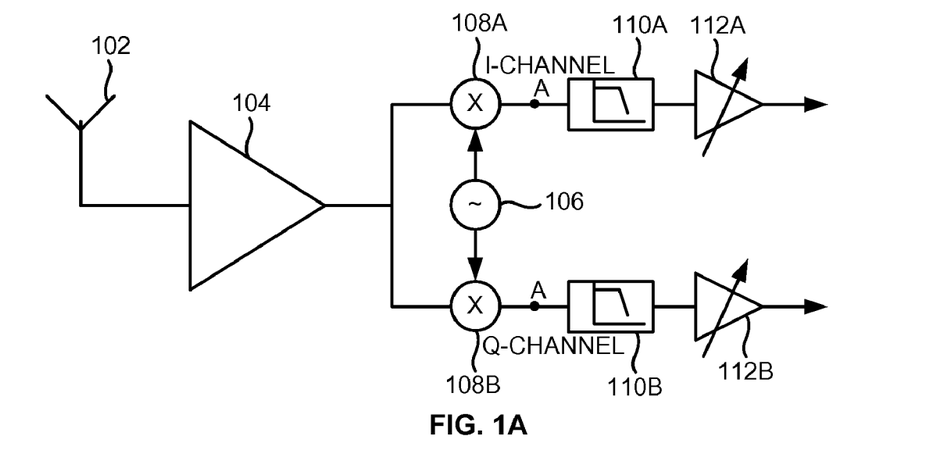
FIG. 1A illustrates a block diagram of a receiver front end.
Figure 1B:
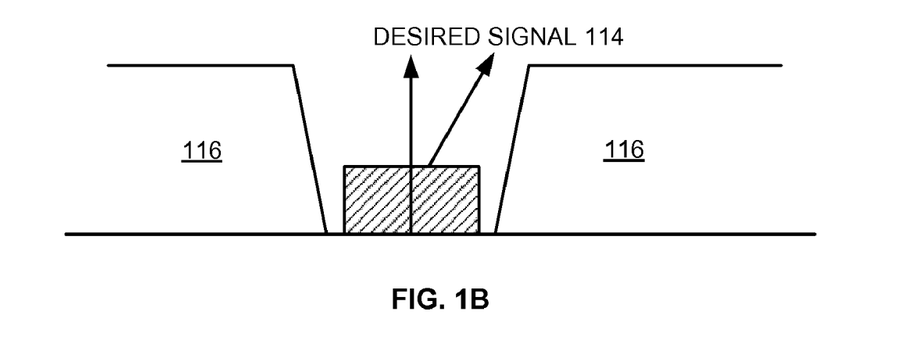
FIG. 1B illustrates a signal profile around a desired channel having a desired signal and blockers.
Figure 1C:
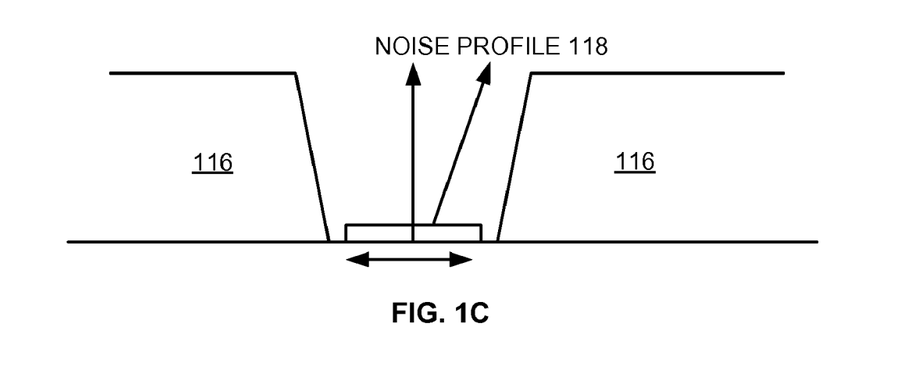
FIG. 1C illustrates a noise profile around a desired channel.

FIG. 1A illustrates a block diagram of a receiver front end having an antenna 102, an amplifier 104, an oscillator 106, a mixer 108A, a mixer 108B, an I-channel waveform 110A, a Q-channel waveform 110B, a variable amplifier 112A, and a variable amplifier 112B. FIG. 1B illustrates a signal profile around a desired channel having a desired signal 114 and blockers 116. FIG. 1C illustrates a noise profile 118 around the desired channel 114. Referring to FIGS. 1A through 1C, the antenna 102 receives a band of frequencies of a signal 114 and sends the signal 114 to the amplifier 104.

The amplifier 104 amplifies the signal 114 and sends it to the mixers 108A, 108B, and the oscillator 106. The I-channel waveform 110A corresponds to the mixer 108A and is amplified by the variable amplifier 112A. The Q-channel waveform 110B corresponds to the mixer 108B and is amplified by the variable amplifier 112B. The desired signal 114 in a specific frequency band (e.g., a desired signal band) is amplified by the amplifier 104, while the blockers 116 (e.g., all unwanted signals) are attenuated outside the specific frequency band. In integrated wireless receivers, the desired signal 114 is down-converted to a baseband frequency together with the blockers 116. The noise 118 out of band signal is not relevant (as in FIG. 1C).

Figure 2A:
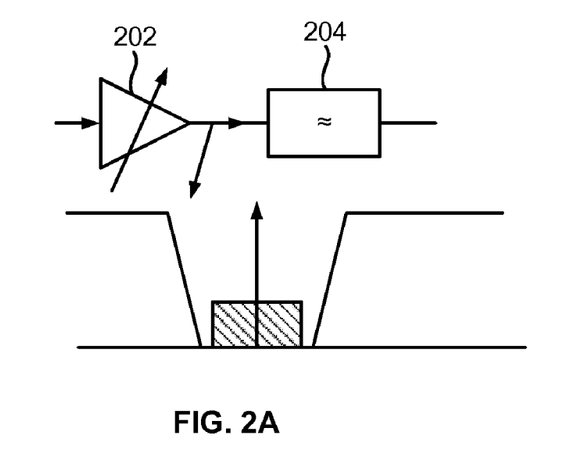
FIGS. 2A through 2D illustrate alternative architectures for the noise-linearity trade off.

FIG. 2A illustrates a noise-linearity trade off in an architecture having an amplifier 202, a filter 204, a desired signal 114, and blockers 116. A baseband section usually amplifies the desired signal 114, and filters out the blockers 116 (e.g., unwanted signal). Thereafter, the desired signal 114 is demodulated to recover the information. The entire filtering operation is performed by the filter 204 at the baseband section as RF front ends typically amplify with a limited gain to the desired signal 114 due to presence of the blockers 116.

Figure 2B:
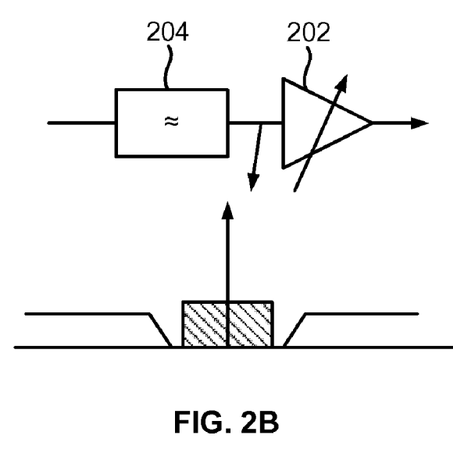

Thereby, the baseband filtering adds minimal noise to the desired signal 114. From a noise perspective, it is usually better to use the amplifier 202 before the filter 204. Additionally, the linearity requirement is higher on the amplifier 202 and the filter 204. FIG. 2B illustrates the noise-linearity trade off in an alternate architecture having the filter 204, the amplifier 202, the desired signal 114, and blockers 116. The linearity requirement is relaxed by first filtering out the desired signal 114 by the filter 204 then amplifying the desired signal 114 by the amplifier 202. The architecture of FIG. 2B places a stringent noise requirement on the filter 204. Hence, architectures of FIG. 2A and FIG. 2B are limited either by linearity or by noise. Therefore implementing higher dynamic range filter(s) 204/amplifier(s) 202 may lead to more power consumption and larger chip area.

Figure 2C:
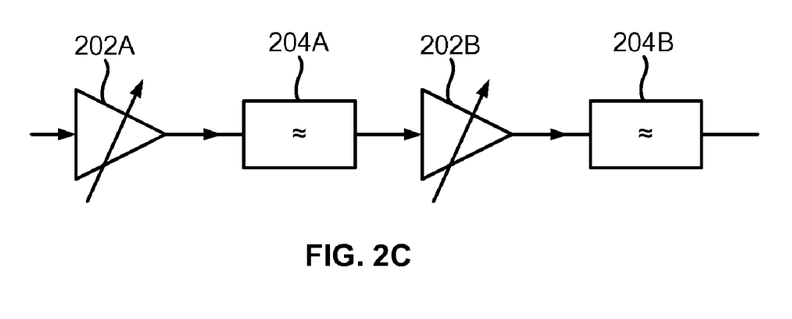

FIG. 2C illustrates the noise-linearity trade off in a gain filter interleaved stages architecture having amplifiers 202A, 202B and filters 204A, 204B. In the interleaved stage architecture, the filtering of the desired signal 114 by the amplifiers 202A, 202B and the amplification of the desired signal 114 by the filters 204A, 204B is performed in an alternative manner consequently to achieve the desired level of gain and noise reduction. The design of the first gain stage and first amplification stage in this architecture is the key to the level of gain and the level of noise reduction in each subsequent stage. Thereby, the architecture of FIG. 2C achieves the linearity and noise to be traded off.

Figure 2D:
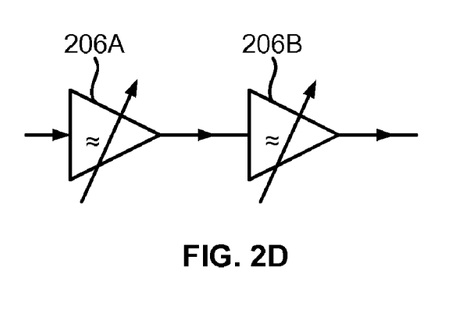

In all the configurations mentioned (e.g., FIGS. 2A through 2C), the filter 204 stages contribute to the overall DC offset and (I/Q) matching of the receiver. FIG. 2D illustrates the noise-linearity trade off in another architecture having amplifiers with filtering 206A, 206B. The architecture of FIG. 2D implements simultaneous gain and filtering by the filtering amplifiers 206A, 206B. The filtering operation in such a stage does not contribute to the noise in the desired signal 114 and rejects the blockers 116 of FIG. 2A before they proceed to further amplification stages. It would be beneficial if the filter components do not contribute any offsets or mismatches to the receive path. The architecture of FIG. 2D achieves optimum linearity without additional noise.

Figure 3:
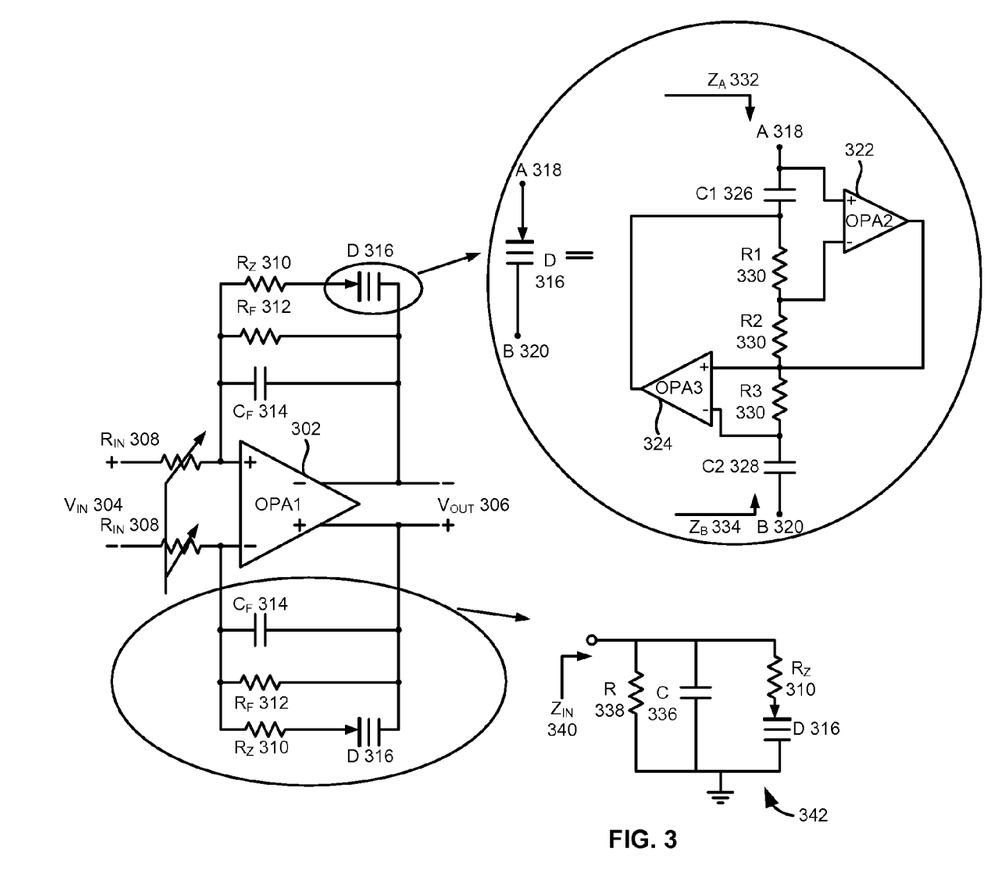
FIG. 3 illustrates a fully differential amplifier.

FIG. 3, with respect to FIGS. 1A through 1C, illustrates a fully differential amplifier topology with the AFFDNR noise shaped filtering element provided by the embodiments herein in the feedback path. The circuit employs a fully-differential operational amplifier (op-amp) OPA1 302 with a common mode feedback, an input terminal $V_{IN}$ 304, an output terminal $V_{OUT}$ 306, a variable resistor $R_{IN}$ 308, a resistor $R_Z$ 310, a feedback resistor $R_F$ 312, a feedback capacitor $C_F$ 314, and a feedthrough AFFDNR D 316 according to an embodiment herein.

Additionally, FIG. 3 includes an equivalent circuit topology 342 having a capacitor 336, a resistor 338, an input impedance 340, the resistor $R_Z$ 310, and the feedthrough AFFDNR D 316. The feedthrough AFFDNR D 316 includes a node A 318, a node B 320, an OPA2 322, an OPA3 324, capacitors C1 326, C2 328, resistors R1 330, R2 330, and R3 330, an impedance $Z_A$ 332 at the node A 318, and an impedance $Z_B$ 334 at the node B 320. In the fully-differential op-amp OPA1 302A of FIG. 3, the op-amp inputs (e.g., the $V_{IN}$ 304 and the $R_{IN}$ 308) are virtually grounded and do not experience any voltage swing.

The fully differential op-amp OPA1 302 amplifies the desired signal 114. The amplifier topology of FIG. 3 acts as an AFFDNR 316 for the filtering function that filters a blocker signal (e.g., the blockers 116 of FIG. 1B). The AFFDNR 316 enables an implementation of complex zeros to realize elliptic transfer functions for a sharper filtering of the blockers 116 of FIG. 1B. The feedback resistor $R_F$ 312 is configured to implement a high order filtering of the blockers 116. The feedback capacitor $C_F$ 314 and the feedthrough AFFDNR D 316 are connected in parallel to the resistor $R_Z$ 310 and the feedback resistor $R_F$ 312. The feedback resistor $R_F$ 312 amplifies and filters the blockers 116 of the signal band.

The feedthrough AFFDNR D 316 is further coupled to the node A 318 and the node B 320. The node A 318 receives a finite input impedance $Z_A$, the finite input impedance $Z_A$ is a negative resistance. The node B 320 receives a finite input impedance $Z_B$, the finite input impedance $Z_B$ is inductive when an opposing port is grounded. The node A 318 is connected to the node B by the capacitors C1 326, C2 328, the resistors R1 330, R2 330, and R3 330, the OPA2 322, and the OPA3 324. The capacitors C1 326, C2 328 are connected in series with the resistors R1 330, R2 330, and R3 330. The OPA2 322 and the OPA3 324 are connected to the capacitors C1 326, C2 328 and the resistors R1 330, R2 330, and R3 330 in parallel.

Figure 4:
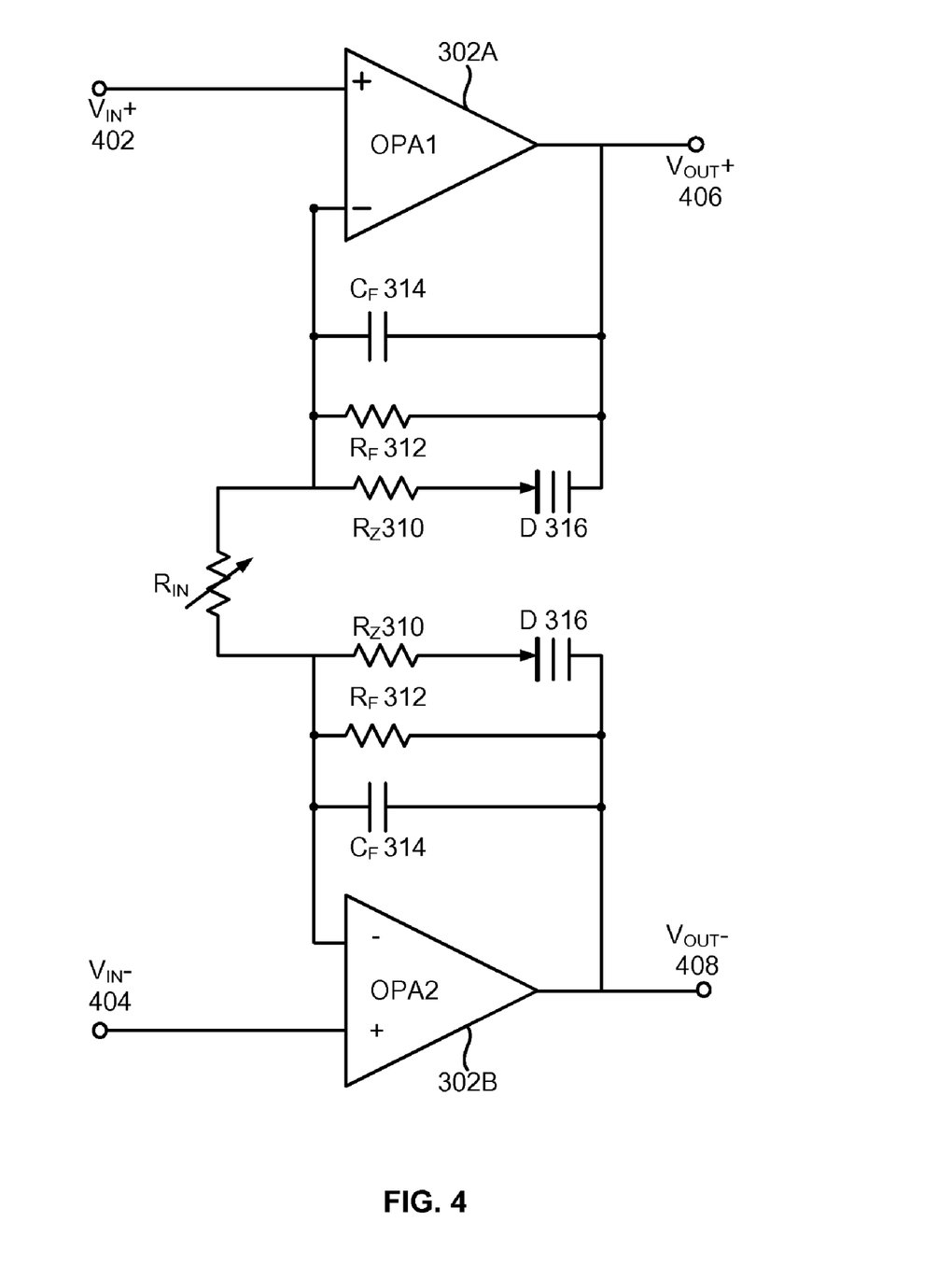
FIG. 4 illustrates an instrumentation topology.

FIG. 4 illustrates an instrumentation topology with the AFFDNR in the feedback path having an OPA1 302A, an OPA2 302B, an input terminal $V_{IN}+$ 402, an input terminal $V_{IN}-$ 404, an output terminal $V_{OUT}+$ 406, an output terminal $V_{OUT}-$ 408, the variable resistor $R_{IN}$ 308, the resistor $R_Z$ 310, the feedback resistor 312, the feedback capacitor 314, and the feedthrough AFFDNR D 316, according to an embodiment herein. The OPA1 302A and the OPA2 302B of FIG. 4 are single-ended op-amps. The inputs of the OPA1 302A and the OPA2 302B (e.g., the $V_{IN}+$ 402, the $V_{IN}-$ 404, the $R_{IN}$ 308) controls the signal swing.

The AFFDNR 316 is a filter function that filters a blocker signal (e.g., the blockers 116 of FIG. 1B). The AFFDNR 316 enables an implementation of complex zeros to realize elliptic transfer functions for a sharper filtering of the blockers 116 of FIG. 1B. The feedback resistor $R_F$ 312 is configured to implement a high order filtering of the blockers 116. The feedback capacitor Cf 314 and the feedthrough AFFDNR D 316 are connected in parallel to the resistor Rz 310 and the feedback resistor $R_F$ 312. The feedback resistor $R_F$ 312 amplifies and filters the blockers 116 of the signal band. The feedback capacitor 314 and the feedthrough AFFDNR D 31 are connected in parallel to the resistor $R_Z$ 310 and the feedback resistor 312.

FIGS. 3 and 4 illustrate topologies for a noise shaped filtering and amplification. FIG. 3 shows the fully differential implementation with finite input impedance, while FIG. 4 shows an instrumentation topology with high input impedance. With reference to FIGS. 3 and 4, the op-amps realize a gain by the feedback resistance of the feedback resistor $R_F$ 312, and input resistance of the variable resistor $R_{IN}$ 308. A filtering stage is placed in a feedback path in parallel with the feedback resistor $R_F$ 312. The feedback resistor $R_F$ 312 is incorporated into a filter transfer function (e.g., the AFFDNR 316) end to serve a dual function (e.g., a gain and a filtering).

When a signal is applied to the input terminal, the feedback path with the AFFDNR 316 poses an impedance of the feedback resistor $R_F$ 312 for the in-band signal whereas blocker signals (e.g., the blockers 116 of FIG. 1B) sees a short to the output terminal $V_{OUT}$ 306, the blocker signals do not experience gain in the signal path. Thus, the linearity spec of the amplifier (e.g., the op-amp OPA1 302) is relaxed since output would not see the blocker voltage swing. In one embodiment, the signal in the desired channel of interest is amplified with third-order elliptic filter characteristic due to the proposed frequency selective feedback.

The AFFDNR 316 is not a reciprocal circuit and the filtering action can be obtained provided that the polarity is as shown in FIG. 3. For example, the impedance $Z_A$ 332 at the node A 318, is desired negative resistance whereas, the impedance $Z_B$ 334 at the node B 320 is inductive when the opposing port is grounded for each case. In this topology (FIGS. 3 and 4), the amplifiers and passive elements realizing the AAFDNR 316 are not in the signal path, so no additional DC offset or I/Q imbalance is introduced by the filtering action. The filtering technique relaxes the linearity spec, and it does not have impact on the noise of the stage.

Thus, the noise generated by the filtering components is shaped outside of the band of the desired channel (e.g., by the noise shaped filter). The noise of all passive and active components (e.g., the $R_Z$ 310, the R1, R2, R3 330, the OPA2 322, and the OPA3 324) in the AFFDNR filter 316 is shaped. Hence, the only substantial noise contributor is the feedback resistor $R_F$ 312 whose noise contribution is accounted for in the amplifier noise budget.

The noise transfer functions from each of the components of the AFFDNR filter 316 are calculated and given as follows: OPA2 322 noise transfer function:

$$\frac{V_{out}(s)}{Vn_{OPA2}(s)} = \frac{sC_1 R_f (1 - s R_1 R_3 C_2 / R_2)}{s^3 D R_z R_f C_f + s^2 (D R_z + D R_f) + s(R_f C_f) + 1}$$

OPA3 324 noise transfer function:

$$\frac{V_{out}(s)}{Vn_{OPA3}(s)} = \frac{sC_1R_fR_1(sR_3C_2+1)}{R_2(s^3DR_zR_fC_f + s^2(DR_z+DR_f) + s(R_fC_f)+1)}$$

$R_Z$ 310 noise transfer function:

$$\frac{V_{out}(s)}{Vn_{Rz}(s)} = \frac{s^2DR_f}{s^3DR_zR_fC_f + s^2(DR_z+DR_f) + s(R_fC_f)+1}$$

R1 330 noise transfer function:

$$\frac{V_{out}(s)}{Vn_{R1}(s)} = \frac{sR_fC_1}{s^3DR_zR_fC_f + s^2(DR_z+DR_f) + s(R_fC_f)+1}$$

R2 330 noise transfer function:

$$\frac{V_{out}(s)}{Vn_{R2}(s)} = \frac{sR_1R_fC_1}{R_2(s^3DR_zR_fC_f + s^2(DR_z+DR_f) + s(R_fC_f)+1)}$$

R3 330 noise transfer function:

$$\frac{V_{out}(s)}{Vn_{R3}(s)} = \frac{sR_1R_fC_1}{R_2(s^3DR_zR_fC_f + s^2(DR_z+DR_f) + s(R_fC_f)+1)}$$

Signal transfer from input to output can be expressed as follows:

$$\frac{V_{out}(s)}{V_{in}(s)} = 1 + \frac{R_f(s^2DR_z+1)}{R_{in}(s^3DR_zR_fC_f + s^2(DR_z+DR_f) + s(R_fC_f)+1)}$$

Figure 5:
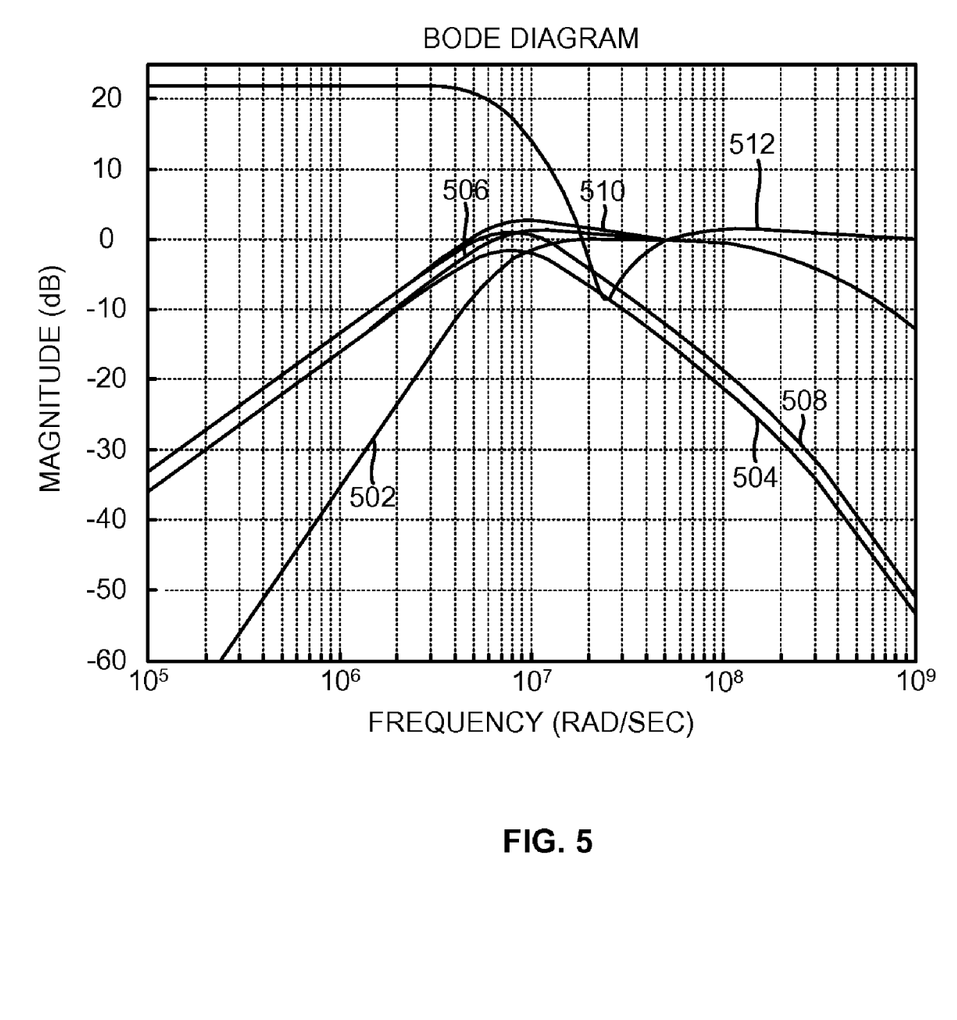
FIG. 5 illustrates a graphical representation of the magnitude of signal and noise transfer functions.

FIG. 5, with reference to FIGS. 1A through 4, illustrates a graphical representation of the magnitude of the signal 114 at various frequencies according to the embodiments herein. The graph is a plot of frequency (rad/sec) along the x-axis and magnitude (dB) along the y-axis. The graph shows plots for the magnitude of noise transfer functions (NTF) of the resistor $R_Z$ 310, R1 330, R2 330, R3 330, OPA1 302, OPA2 322, and a signal transfer function (Signal TF). The graph shows six different curves 502-512. The curve 502 corresponds to the resistor $R_Z$ 310, the curve 504 corresponds to the resistor R1 330, the curve 506 corresponds to the op-amp OPA1 302, the curve 508 corresponds to the resistors R2 330, R3 330, the curve 510 corresponds to the op-amp OPA2 322, and the curve 502 corresponds to a signal TF 524.

The curve 502 shows a steady increase in magnitude from −60 dB to 0 dB with an increase in frequency, and shows a constancy of 0 dB for an increase in frequency from $10^7$ to $10^8$ (rad/sec), after which the magnitude falls in the range −10 to −20 dB with further frequency increase. The curve 504 shows a steady increase of magnitude (−35 dB to 0 dB) with an increase in frequency, reaches a peak at the frequency of $10^7$ rad/sec, and starts decreasing with further increase in the frequency and finally drops to −55 dB at the frequency $10^9$ rad/sec.

The curve 506 shows a steady increase of magnitude (−35 dB to 0 dB) with an increase in frequency, reaches a peak at the frequency of $10^7$ rad/sec, shows a constant magnitude of 0 dB for an increase in frequency from $10^7$ to $10^8$ (rad/sec), after which the magnitude falls in the range −10 to −20 dB with further frequency increase. The curve 508 shows a steady increase of magnitude (−33 dB to 0 dB) with an increase in frequency, reaches a peak at the frequency of $10^7$ rad/sec, and starts decreasing with further increase in the frequency and finally drops to −50 dB at the frequency $10^9$ rad/sec.

The curve 510 shows a steady increase of magnitude (−33 dB to 0 dB) with an increase in frequency, reaches a peak at the frequency of $10^7$ rad/sec, shows a constant magnitude of 0 dB for an increase in frequency from $10^7$ to $10^8$ (rad/sec), and finally falls in the range −10 to −20 dB with further frequency increase. The curve 512 shows a constant magnitude of 20 dB when the frequency is increased from $10^5$ to $10^7$ rad/sec, after which the magnitude drops down to −10 dB, and again starts increasing slowly with increase in frequency and attains a constant magnitude of 0 dB, when the frequency increase to $10^9$ db.

Figure 6:
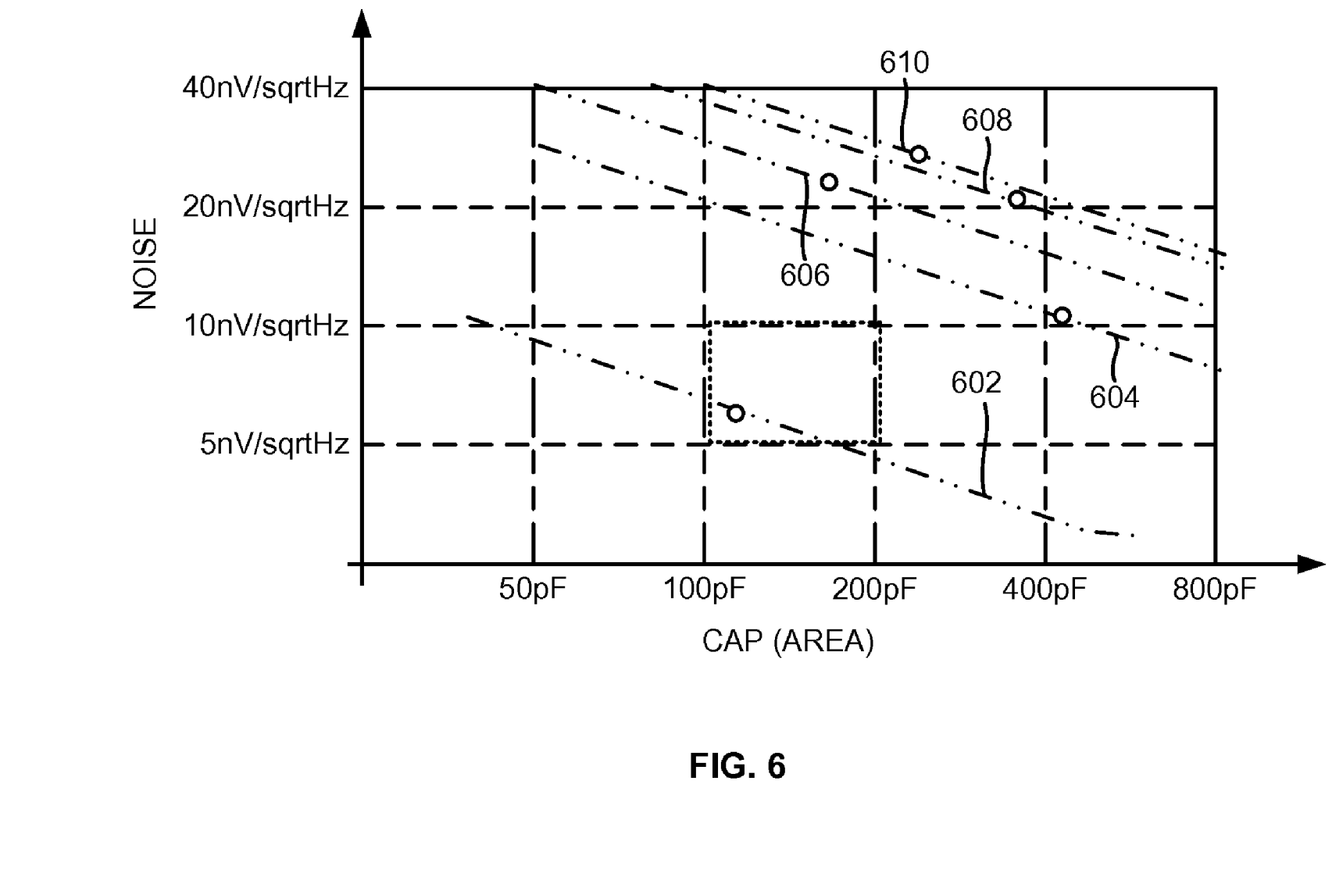
FIG. 6 illustrates a graphical representation of the desired noise level versus required capacitor value for a range of filter topologies.

FIG. 6 illustrates a graphical representation of the desired noise level versus required capacitor value curves for a range of filter topologies targeting the same filter cut-off frequency of approximately 3.5-MHz. The graph is a plot of capacitance (pF) along the x-axis and noise (nV/sqrtHz) along the y-axis. The graph shows plots for different filter topologies. The graph shows five different straight lines 602-610. The line 602 corresponds to an AFFDNR topology, the line 604 corresponds to a Sallen Key topology, the line 606 corresponds to a Leap-Frog topology, the line 608 corresponds to a MFB topology and the line 610 corresponds to a Akerberg-Mosberg topology. The line 602 shows a constant decrease in the noise with increase in the capacitance from 50 pF to 400 pF, after which it shows a minimal constancy in the noise value. The lines 504 and 506 show a constant decrease in the noise value when the capacitance value increases from 50 pF to 800 pF. Also, the lines 508 and 510 show that the noise value decreases steadily with increase in the capacitance value from 100 pF to 800 pF.

Figure 7:
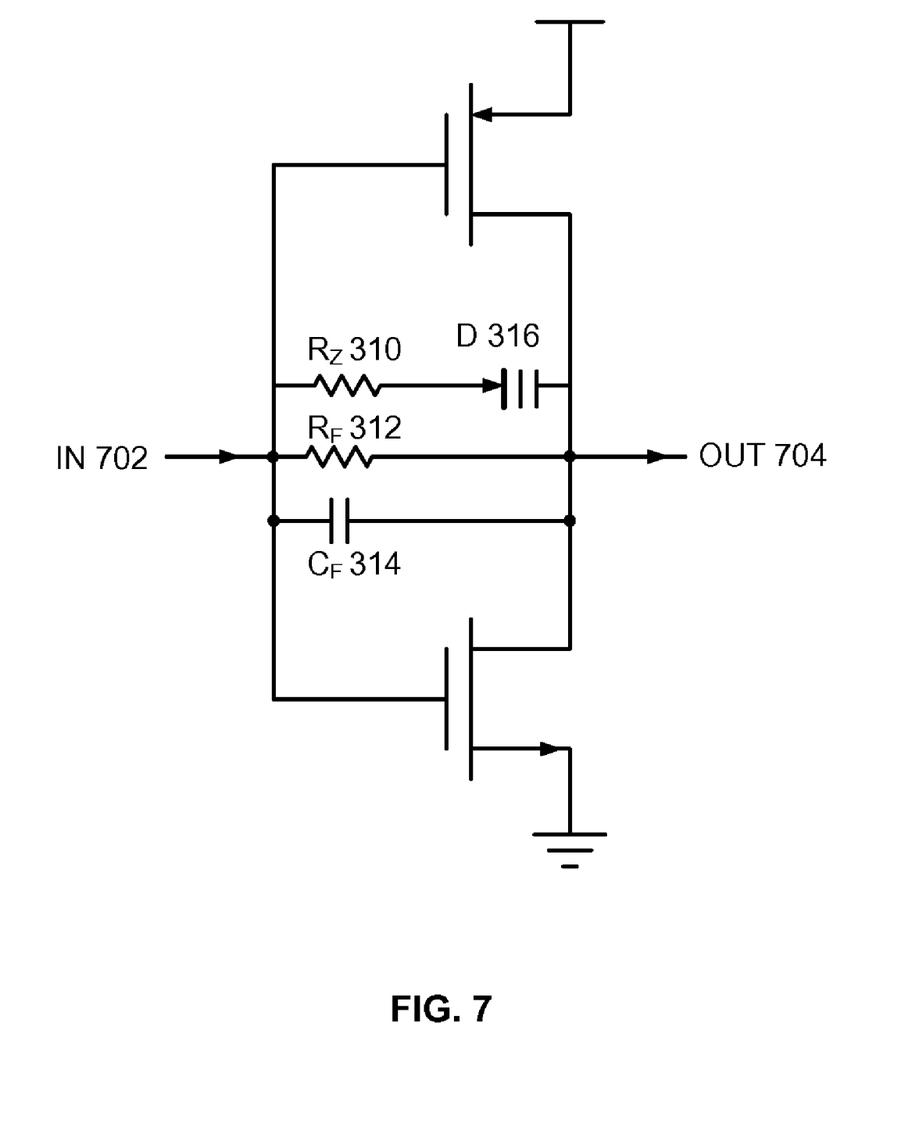
FIG. 7 illustrates a two-transistor common-source feedback configuration.

FIG. 7, with reference to FIGS. 3 and 4, illustrates a two-transistor common-source feedback configuration having an input 702, an output 704, the resistor $R_Z$ 310, the feedback resistor $R_F$ 312, the feedback capacitor Cf 314 and a feedthrough AFFDNR D 316, according to an embodiment herein. FIG. 7 is an alternative embodiment of a much simpler configuration which is in the feedback of the two-transistor common source amplifier. The architecture of FIG. 7 is desirable for very low noise applications where the noise of the gain stage is reduced to the noise of the two transistors only as the noise in the AFFDNR 316 (of FIGS. 3 and 4) based filtering section is already shaped.

Figure 8:
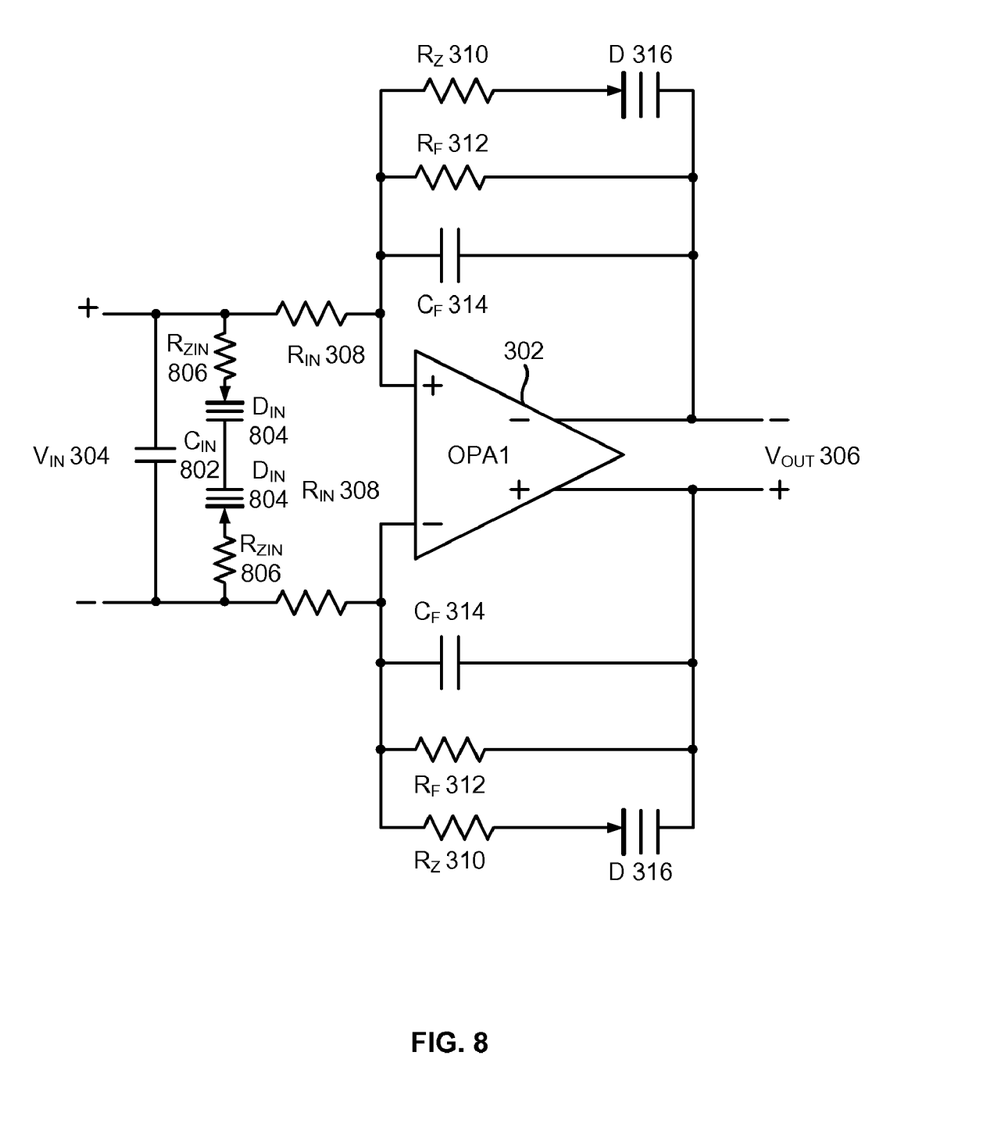
FIG. 8 illustrates a fully differential cascade topology.

FIG. 8, with reference to FIGS. 3 and 5, illustrates a fully differential cascade topology having the fully-differential operational amplifier (op-amp) OPA1 302 with common mode feedback, the input terminal $V_{IN}$ 304, the output terminal $V_{OUT}$ 306, the variable resistor $R_{IN}$ 308, the resistor $R_Z$ 310, the feedback resistor $R_F$ 312, the feedback capacitor 314, the feedthrough AFFDNR D 316, a capacitor $C_{IN}$ 802, a feedthrough AFFDNR $D_{IN}$ 804, and a pair of resistors $R_{ZIN}$ 806 according to an embodiment herein. The configuration of FIG. 8 utilizes the input resistance of the OPA1 302, the $R_{IN}$ 308, the AFFDNR $D_{IN}$ 804, and the feedthrough AFFDNR D 316 to implement a cascade system. The blockers 116 of FIG. 1B are pre-filtered before reaching the feedback path in the OPA1 302 by the combination of the $R_{IN}$ 308, $C_{IN}$ 802, the $D_{IN}$ 804, and the pair of resistors $R_{ZIN}$ 806 at the input of OPA1. This combination is a third-order elliptic section which this time utilizes the input gain resistance $R_{IN}$ 308 for a second purpose, namely filtering.

Figure 9:
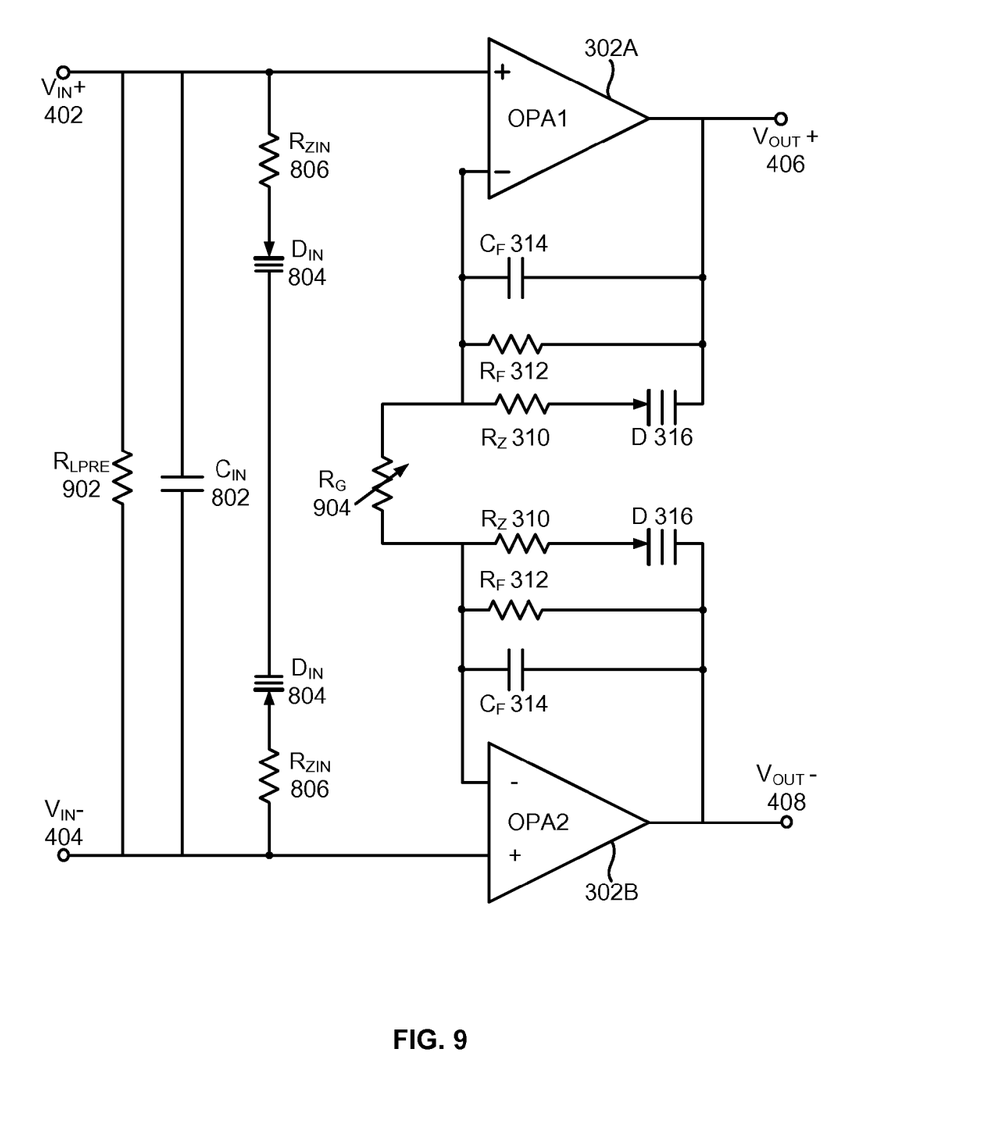
FIG. 9 illustrates a cascade instrumentation topology.

Thus, larger blockers may be handled without an additional noisy element. FIG. 9, with reference to FIGS. 3 and 4, illustrates a cascade instrumentation topology having the op-amp OPA1 302A, the op-amp OPA2 302B, the input terminal $V_{IN}$+ 402, the input terminal $V_{IN}$− 404, the output terminal $V_{OUT}$+ 406, the output terminal $V_{OUT}$− 408, the resistor $R_Z$ 310, the feedback resistor 312, the feedback capacitor 314, the capacitor $C_{IN}$ 802, the AFFDNR $D_{IN}$ 804, the pair of resistors $R_{ZIN}$ 806, a resistor $R_{LPRE}$ 902, and a variable resistor $R_G$ 904, and the feedthrough AFFDNR D 316, according to an embodiment herein. The topology in FIG. 9 uses the load resistance of the proceeding stage, $R_{LPRE}$, thus requiring no additional noisy element.

Figure 10:
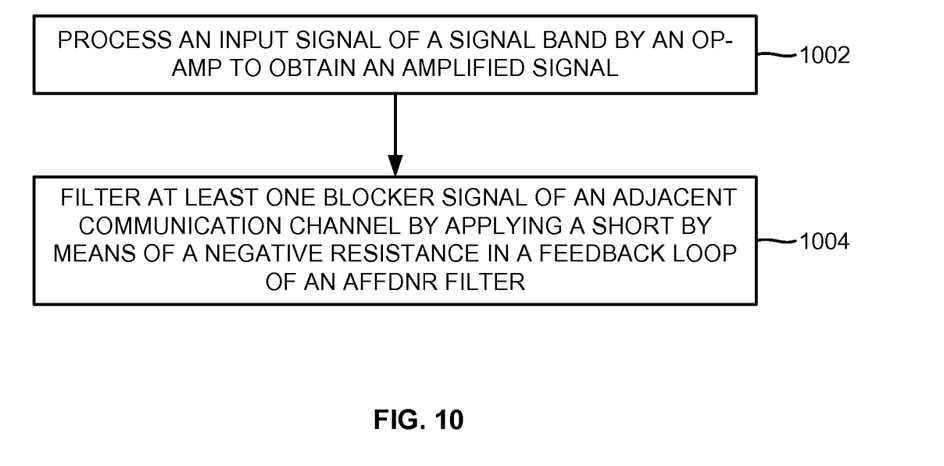
FIG. 10 is a flow diagram illustrating a method of amplifying and filtering a signal band of a communications channel in a gain-filtering architecture.

FIG. 10 is a flow diagram illustrating a method of amplifying and filtering a signal band of a communications channel in a gain-filtering architecture. In step 1002, an input signal from a signal band is processed by an op-amp to obtain an amplified signal. For example, the desired signal 114 of FIG. 1B is amplified by the fully differential op-amp OPA1 302 of FIG. 3. In step 1004, a blocker signal of an adjacent communications channel is filtered by applying a short (e.g., by means of a negative resistance in a feedback loop of an AFFDNR filter). For example, the amplifier topology of FIG. 3 acts as an AFFDNR 316 for a filtering function that filters a blocker signal (e.g., the blockers 116 of FIG. 1B).

The techniques provided by the embodiments herein may be implemented on an integrated circuit chip (not shown). The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Amplification of a desired signal in the desired channel is accompanied with the high-order filtering of the strong blockers in the nearby channels to increase the sensitivity of the overall system. A low noise operation is achieved with small device area and low-power consumption due to noise shaping characteristics of AFFDNR. The noise of all passive and active components used to realize the filtering operation is shaped and moved out of the pass-band of the filter. The embodiments herein utilize noise shaping properties of an AFFDNR and hence can achieve high order filtering without additional in band noise. All components employed in the filtering section do not contribute any DC-offsets to the signal path.

The feedback resistance of the amplifier is incorporated into the filter transfer function so that no additional noise source is used for filtering purpose. Due to the implementation of complex zeros, elliptic transfer functions can be realized for sharper attenuation. Because of noise shaping, the AFFDNR section 316 in the feedback path can use larger values of resistors without degrading the noise performance. This, in turn, reduces the capacitor values which results in a considerable area saving. The technique provided by the embodiments herein may be used in handheld and portable devices which have demanding specs for area and power consumption.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. A fully differential amplifier that amplifies and filters a signal band of a communications channel, wherein said signal band comprises a desired signal and at least one blocker signal of an adjacent communications channel, said fully differential amplifier comprising:
    a fully differential operational amplifier (op-amp) with a common mode feedback, said fully differential operational amplifier amplifying said desired signal;
    a variable input resistance connected to an input of said fully differential op-amp; and
    an asymmetric floating frequency dependent negative resistance (AFFDNR) filter connected to said fully differential op-amp between said input and an output of said fully differential op-amp, said AFFDNR filter filtering said at least one blocker signal,
    wherein said AFFDNR filter comprises a plurality of resistors that implement a high order filtering of said at least one blocker signal.

2. The fully differential amplifier of claim 1, wherein said AFFDNR filter enables an implementation of complex zeros to realize elliptic transfer functions for a sharper filtering of said at least one blocker signal.

3. The fully differential amplifier of claim 1, wherein a plurality of inputs of said fully differential op-amp is virtually grounded to reduce swings in a voltage.

4. The fully differential amplifier of claim 1, wherein said plurality of resistors comprises at least one of a feedback resistance and an impedance resistance, said feedback resistance amplifying and filtering said signal band.

5. The fully differential amplifier of claim 1, wherein said fully differential op-amp obtains a predetermined gain with said feedback resistance and said variable input resistance.

6. The fully differential amplifier of claim 1, wherein said AFFDNR filter comprises a plurality of amplifiers, a plurality of capacitors, and plurality of resistors.

7. The fully differential amplifier of claim 6, wherein said plurality of capacitors comprises at least one of a feedback capacitor and a feedthrough AFFDNR.

8. The fully differential amplifier of claim 7, wherein said feedthrough AFFDNR is coupled to a first node and a second node, said first node receiving a finite input impedance $Z_A$, wherein said $Z_A$ is a negative resistance when an opposing port is grounded, and said second node receiving a finite input impedance $Z_B$, wherein said $Z_B$ is inductive when the opposing port is grounded.

9. The fully differential amplifier of claim 8, wherein in said feedthrough AFFDNR, said first node is coupled to said second node by a plurality of capacitors, a plurality of resistors, a first op-amp, and a second op-amp, wherein said plurality of capacitors are connected in series with said plurality of resistors, wherein said first op-amp and said second op-amp are connected to said plurality of capacitors and said plurality of resistors in parallel.

10. An electrical circuit using an asymmetric floating frequency dependent negative resistance (AFFDNR) in a feedback path to amplify and filter a signal band of a communications channel, wherein said signal band comprises a desired signal and at least one blocker signal of an adjacent communications channel, said electrical circuit comprising:
 a plurality of single-ended operational amplifiers (op-amps) amplifying said desired signal and connected in parallel to each other;
 a variable input resistance connected to an input of the op-amps; and
 an AFFDNR filter connected in parallel to said op-amps between said input and an output of said op-amps, said AFFDNR filtering said at least one blocker signal,
 wherein said AFFDNR filter comprising a plurality of resistors that implement a high order filtering of said at least one blocker signal.

11. The electrical circuit of claim 10, wherein said input of said op-amps controls a signal swing.

12. The electrical circuit of claim 10, wherein said AFFDNR filter enables an implementation of complex zeros to realize elliptic transfer functions for a sharper filtering of said at least one blocker signal.

13. The electrical circuit of claim 10, wherein said plurality of resistors comprises at least one of a feedback resistance and an impedance resistance, said feedback resistance amplifying and filtering said signal band.

14. The electrical circuit of claim 10, further comprising a filtering section comprising a capacitor connected in parallel to a resistor, and an AFFDNR.

15. A method of amplifying and filtering a signal band of a communications channel in a gain-filtering architecture, wherein said signal band comprises a desired signal and at least one blocker signal of an adjacent communications channel, wherein said gain-filtering architecture comprises an operational amplifier (op-amp) and an asymmetric floating frequency dependent negative resistance (AFFDNR) filter, said method comprising:
 processing an input signal of said signal band by said op-amp to obtain an amplified signal; and
 filtering said at least one blocker signal of an adjacent communications channel by applying a short by means of a negative resistance in a feedback loop of said AFFDNR filter.

16. The method of claim 15, wherein said op-amp is at least one of a single fully differential op-amp and a plurality of single ended op-amps.

17. The method of claim 15, wherein said feedback loop of said AFFDNR filter comprises a plurality of resistors implementing a high order filtering of said at least one blocker signal.

18. The method of claim 17, wherein said plurality of resistors comprise at least one of a feedback resistance and an impedance resistance, said feedback resistance amplifying and filtering said signal band.

19. The method of claim 15, wherein said filtering is performed by a filtering section comprising a capacitor connected in parallel to a resistor and an AFFDNR.

* * * * *